(12) United States Patent
Tanzawa

(10) Patent No.: US 8,743,622 B2
(45) Date of Patent: Jun. 3, 2014

(54) MEMORY DEVICES AND PROGRAMMING METHODS THAT PROGRAM A MEMORY CELL WITH A DATA VALUE, READ THE DATA VALUE FROM THE MEMORY CELL AND REPROGRAM THE MEMORY CELL WITH THE READ DATA VALUE

(75) Inventor: Toru Tanzawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 184 days.

(21) Appl. No.: 13/349,652

(22) Filed: Jan. 13, 2012

(65) Prior Publication Data

US 2013/0182510 A1    Jul. 18, 2013

(51) Int. Cl.
*G11C 16/04* (2006.01)

(52) U.S. Cl.
USPC ............ 365/185.24; 365/185.03; 365/185.18; 365/185.19

(58) Field of Classification Search
USPC .............. 365/185.24, 185.03, 185.18, 185.19
See application file for complete search history.

(56) References Cited

U.S. PATENT DOCUMENTS

| | | | |
|---|---|---|---|
| 6,967,873 B2 | 11/2005 | Hamilton et al. | |
| 7,324,383 B2 | 1/2008 | Incarnati et al. | |
| 7,489,543 B1 | 2/2009 | Lee | |
| 7,561,467 B2 | 7/2009 | Kang et al. | |
| 7,688,634 B2 * | 3/2010 | Richter et al. | 365/185.2 |
| 7,830,718 B2 | 11/2010 | Sarin et al. | |
| 7,835,183 B2 | 11/2010 | Yamashita | |
| 7,907,452 B2 * | 3/2011 | Park et al. | 365/185.19 |
| 7,936,599 B2 | 5/2011 | Roohparvar et al. | |
| 8,279,679 B2 * | 10/2012 | Kamigaichi et al. | 365/185.22 |
| 2010/0172185 A1 | 7/2010 | Kim | |

OTHER PUBLICATIONS

Fujiki et al., "Successful Suppression of Dielectric Relaxation Inherent to High-k NAND from Both Architecture and Material Points of View," pp. 16.7.1-16.7.3, 2009.
Sim et al., "Observation and Effective Suppression of Dielectric Relaxation in Charge-Trap NAND Flash Memory," 2011.
Sandhya et al., "Impact of SiN Composition Variation on SANOS Memory Performance and Reliability Under NAND (FN/FN) Operation," Transactions on Electron Devices, vol. 56, No. 12, pp. 3123-3132, Dec. 2009.

* cited by examiner

*Primary Examiner* — Connie Yoha
(74) *Attorney, Agent, or Firm* — Dicke, Billig & Czaja, PLLC

(57) ABSTRACT

Memory devices and programming methods are disclosed. In an embodiment of one such method, a memory cell is programmed to at least a first threshold voltage. After programming the memory cell to at least the first threshold voltage, the memory cell is read, using a read voltage that is less than the first threshold voltage. After reading the memory cell, the memory cell is programmed to at least a second threshold voltage that is greater than the first threshold voltage.

33 Claims, 4 Drawing Sheets

MEMORY DEVICES AND PROGRAMMING METHODS THAT PROGRAM A MEMORY CELL WITH A DATA VALUE, READ THE DATA VALUE FROM THE MEMORY CELL AND REPROGRAM THE MEMORY CELL WITH THE READ DATA VALUE

FIELD

The present disclosure relates generally to memories, and, in particular, the present disclosure relates to memory devices and programming methods.

BACKGROUND

Memory devices are typically provided as internal, semiconductor, integrated circuits in computers or other electronic devices. There are many different types of memory including random-access memory (RAM), read only memory (ROM), dynamic random access memory (DRAM), synchronous dynamic random access memory (SDRAM), and flash memory.

Flash memory devices (e.g., NAND, NOR, etc.) have developed into a popular source of non-volatile memory for a wide range of electronic applications. Non-volatile memory is memory that can retain its data values for some extended period without the application of power. Flash memory devices typically use a one-transistor memory cell that allows for high memory densities, high reliability, and low power consumption. Changes in threshold voltage of the memory cells, through programming (which is sometimes referred to as writing) of charge-storage structures (e.g., floating gates or charge traps) or other physical phenomena (e.g., phase change or polarization), determine the data value of each memory cell. Common uses for flash memory and other non-volatile memory may include personal computers, personal digital assistants (PDAs), digital cameras, digital media players, digital recorders, games, appliances, vehicles, wireless devices, mobile telephones, and removable memory modules, and the uses for non-volatile memory continue to expand.

In a NOR flash architecture, a column of memory cells are coupled in parallel with each memory cell coupled to a data line, such as a bit line. A "column" refers to a group of memory cells that are commonly coupled to a local data line, such as a local bit line. It does not require any particular orientation or linear relationship, but instead refers to the logical relationship between memory cell and data line.

Typically, the array of memory cells for NAND flash memory devices is arranged such that the control gate of each memory cell of a row of the array is connected together to form an access line, such as a word line. Columns of the array include strings (often termed NAND strings) of memory cells connected together in series, e.g., source to drain, between a pair of select lines, e.g., a source select line and a drain select line. The source select line includes a source select gate at each intersection between a NAND string and the source select line, and the drain select line includes a drain select gate at each intersection between a NAND string and the drain select line. Each source select gate is connected to a source line, while each drain select gate is connected to a data line, such as column bit line.

Each memory cell can be programmed as a single bit per memory cell (i.e., single-level cell—SLC) or multiple bits per cell (i.e., multilevel cell—MLC). Each memory cell's threshold voltage (Vt) determines the data that is stored in the cell. For example, for a single-level memory cell, a particular program Vt (e.g., a positive Vt) might indicate a first data value, while a particular erase Vt (e.g., a negative Vt) might indicate a second data value. For a single-level programming, each memory cell of a number of memory cells (e.g., an array of memory cells) may be programmed to one of two data states, each indicating a different data value. For example, a first data value may correspond to an erase data state of the memory cell, and a second data value may correspond to a program data state of the memory cell, where the erase data state may be characterized by a distinct range of erase threshold voltages (e.g., that may be negative) and the program data state may be characterized by a distinct range of program threshold voltages (e.g., that may be positive).

Multilevel memory cells take advantage of the analog nature of a traditional flash memory cell by assigning a respective data value (e.g., as represented by a bit pattern) to each of a plurality of data states, e.g., to each of a plurality of distinct ranges of threshold voltages (Vt) that can be stored on the memory cells. Each data state may be characterized by a corresponding distinct range of threshold voltages. A margin (e.g., a certain number of volts), such as a dead space, may separate adjacent data states, e.g., to facilitate differentiating between data values. This technology permits the storage of two or more bits per memory cell, depending on the quantity of data states, and the stability of threshold voltages during the lifetime operation of the memory cells. The number of data states, which are sometimes also referred to as threshold-voltage-distribution windows, used to represent a bit pattern of N bits may be $2^N$.

With time, from the initial programming of a memory cell, the range of threshold voltages for the program data states of a single-level memory cell or for any of the program data states of a multilevel memory cell may spread out as individual memory cell threshold voltages increase (e.g., due to charge redistribution within the memory cell, etc.) so that the range of threshold voltages for each of the program data states may be wider than when initially programmed. This phenomenon may be referred to as relaxation. For example, when a programming voltage is applied to the control gate of a memory cell, charges may be retained at an interface between a blocking dielectric, located between the control gate and the charge-storage structure, and the charge-storage structure. With time, these charges migrate from the interface into the charge-storage structure, thereby causing the threshold voltage to increase.

For multilevel memory cells, the wider ranges may cause the program data states to be closer together so that the margins between these data states are narrower. This can cause difficulties when trying to differentiate between possible data states of a multilevel memory cell.

For the reasons stated above, and for other reasons stated below which will become apparent to those skilled in the art upon reading and understanding the present specification, there is a need in the art for alternatives for programming memory cells.

DETAILED DESCRIPTION

Figure 1:
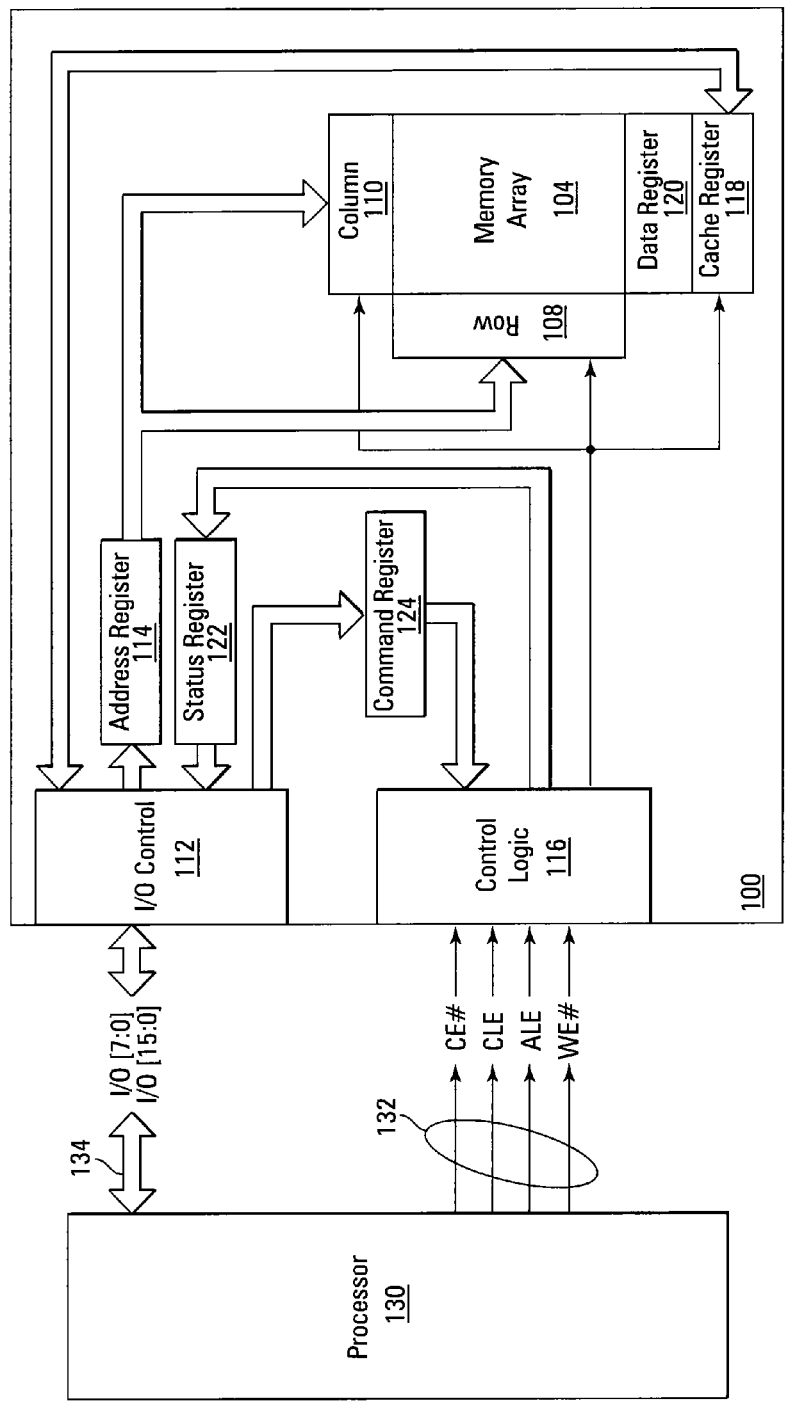
FIG. 1 is a simplified block diagram of a memory system, according to an embodiment.

In the following detailed description, reference is made to the accompanying drawings that form a part hereof, and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 is a simplified block diagram of a NAND flash memory device 100 in communication with a processor 130 as part of an electronic system, according to an embodiment. The processor 130 may be a memory controller or other external host device. Memory device 100 includes an array of memory cells 104. A row decoder 108 and a column decoder 110 are provided to decode address signals. Address signals are received and decoded to access memory array 104.

Memory device 100 also includes input/output (I/O) control circuitry 112 to manage input of commands, addresses, and data to the memory device 100 as well as output of data and status information from the memory device 100. An address register 114 is in communication with I/O control circuitry 112, and row decoder 108 and column decoder 110, to latch the address signals prior to decoding. A command register 124 is in communication with I/O control circuitry 112 and control logic 116 to latch incoming commands Control logic 116 controls access to the memory array 104 in response to the commands and generates status information for the external processor 130. The control logic 116 is in communication with row decoder 108 and column decoder 110 to control the row decoder 108 and column decoder 110 in response to the addresses.

For some embodiments, control logic 116 may be configured to cause memory device 100 to perform the various methods of programming memory array 104 disclosed herein. For example, control logic 116 may be configured to cause memory device 100 to program a plurality of target memory cells to at least a first program threshold voltage (e.g., a first program verify voltage), then to wait (e.g., while performing other operations, such as programming or reading other cells), then to read the target memory cells using a first read voltage, e.g., less than the first program threshold voltage, to determine their data state, and then to program the target memory cells a second time to at least a second, higher program threshold voltage (e.g., a second program verify voltage). The memory cells may be read again after they are programmed to at least the second program threshold voltage with a second read voltage, e.g., less than the second program threshold voltage and greater than the first read voltage. The first read voltage is less than the first program threshold voltage to determine what the original data is for each target memory cell. The read data states may be used to program target memory cells the second time until they reach at least the second threshold voltage.

Control logic 116 is also in communication with a cache register 118. Cache register 118 latches data, either incoming or outgoing, as directed by control logic 116 to temporarily store data while the memory array 104 is busy writing or reading, respectively, other data. During a write operation, data is passed from the cache register 118 to data register 120 for transfer to the memory array 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals may include at least a chip enable CE#, a command latch enable CLE, an address latch enable ALE, and a write enable WE#. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of bus 134 at I/O control circuitry 112 and are written into address register 114. The data are received over input/output (I/O) pins [7:0] for an 8-bit device or input/output (I/O) pins [15:0] for a 16-bit device at I/O at control circuitry 112 and are written into cache register 118. The data are subsequently written into data register 120 for programming memory array 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2:
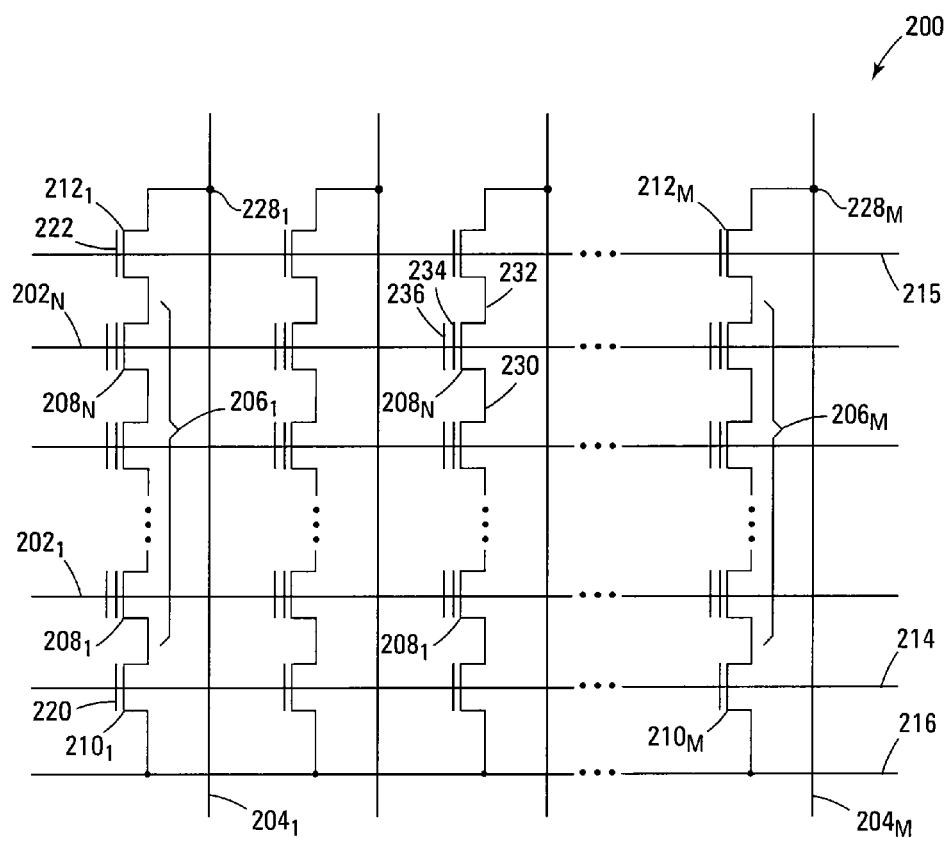
FIG. 2 is a schematic of a NAND memory array, according to another embodiment.

FIG. 2 is a schematic of a NAND memory array 200, e.g., as a portion of memory array 104, in accordance with another embodiment. Memory array 200 includes access lines, such as word lines $202_1$ to $202_N$, and intersecting data lines, such as bit lines $204_1$ to $204_M$. For ease of addressing in the digital environment, the number of word lines 202 and the number of bit lines 204 are each some power of two, e.g., 256 word lines 202 by 4,096 bit lines 204. The bit lines 204 may be coupled to global data lines, such as global bit lines (not shown), in a many-to-one relationship.

Memory array 200 is arranged in rows (each corresponding to a word line 202) and columns (each corresponding to a bit line 204). Each column may include a string, such as one of NAND strings $206_1$ to $206_M$. Each NAND string 206 is coupled to a common source line 216 and includes memory cells $208_1$ to $208_N$, each located at an intersection of a word line 202 and a bit line 204. The memory cells 208 represent non-volatile memory cells for storage of data. The memory cells 208 of each NAND string 206 are connected in series, source to drain, between a source select line 214 and a drain select line 215.

Source select line 214 includes a source select gate 210, e.g., a field-effect transistor (FET), at each intersection between a NAND string 206 and source select line 214, and drain select line 215 includes a drain select gate 212, e.g., a field-effect transistor (FET), at each intersection between a NAND string 206 and drain select line 215. In this way, the memory cells 208 of each NAND string 206 are connected between a source select gate 210 and a drain select gate 212.

A source of each source select gate 210 is connected to common source line 216. The drain of each source select gate 210 is connected to the source of the memory cell 208 of the corresponding NAND string 206. For example, the drain of source select gate $210_1$ is connected to the source of memory cell $208_1$ of the corresponding NAND string $206_1$. Therefore, each source select gate 210 selectively couples a corresponding NAND string 206 to common source line 216. A control gate 220 of each source select gate 210 is connected to source select line 214.

The drain of each drain select gate 212 is connected to the bit line 204 for the corresponding NAND string at a drain contact 228. For example, the drain of drain select gate $212_1$ is connected to the bit line $204_1$ for the corresponding NAND string $206_1$ at drain contact $228_1$. The source of each drain select gate 212 is connected to the drain of a memory cell $208_N$ of the corresponding NAND string 206. For example, the source of drain select gate $212_1$ is connected to the drain of memory cell $208_N$ of the corresponding NAND string $206_1$. Therefore, each drain select gate 212 selectively couples a corresponding NAND string 206 to a corresponding bit line 204. A control gate 222 of each drain select gate 212 is connected to drain select line 215.

Typical construction of memory cells 208 includes a source 230 and a drain 232, a charge-storage structure 234 (e.g., a floating gate, charge trap, etc.) that can store a charge that determines a data value of the memory cell, and a control gate 236, as shown in FIG. 2. Memory cells 208 have their control gates 236 coupled to (and in some cases forming) a word line 202. A column of the memory cells 208 is a NAND string 206 coupled to a given bit line 204. A row of the memory cells 208 are those memory cells commonly coupled to a given word line 202.

Although the examples of FIGS. 1 and 2 were discussed in conjunction with NAND flash, the embodiments described herein are not limited to NAND flash, but can include other flash architectures, such as NOR flash, etc.

Figure 3A:
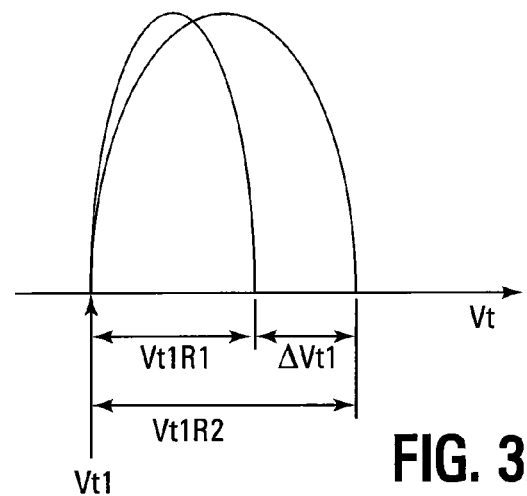
FIGS. 3A-3C illustrate program threshold voltage ranges at various stages of programming, according to another embodiment.
Figure 3B:
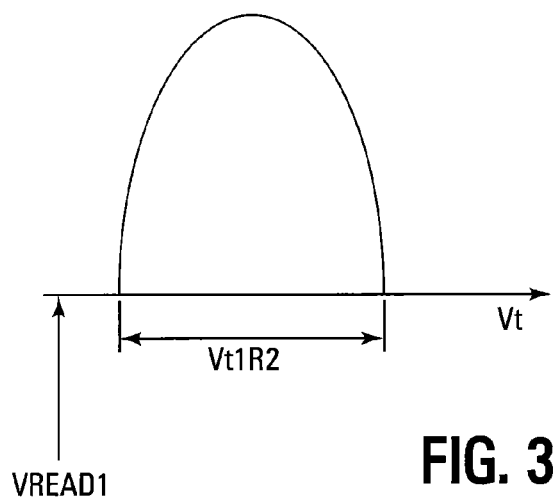
Figure 3C:
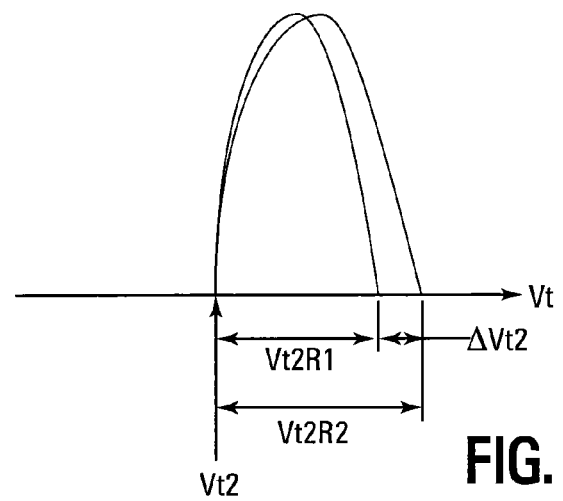

FIGS. 3A-3C illustrate program threshold voltage ranges of a representative program data state of a memory cell at various stages of programming during a programming cycle, according to embodiments of the disclosure. For example, the program data state may be a program data state for a single-level memory cell or the program data state may be any one of a plurality of program data states of a multilevel memory cell.

The program data state may be assigned a logic 0 state, for example, for a single bit per memory cell programming or one of logic states 10, 00, or 01, for example, for a two-bit per memory cell programming. For other embodiments, the program data state may correspond to any one of a plurality of program data states of a plurality of multilevel memory cells.

The program threshold voltage ranges depicted in FIGS. 3A-3C may represent a distribution for a plurality of target memory cells (e.g., a page or a portion of a page of memory cells targeted for programming to a particular program data state) coupled to a common selected word line, such as a plurality of target memory cells 208 coupled to a selected word line 202 in FIG. 2. For example, the selected word line 202 may be coupled to the control gates 236 of target memory cells 208.

Unselected word lines may be biased by voltages intended to inhibit programming of memory cells coupled to those word lines. Not all memory cells coupled to a selected word line need be targeted for programming. As is known in the art, intersecting bit lines corresponding to memory cells of the selected word line that are not targeted for programming may also be biased to voltages intended to inhibit programming of such memory cells.

For some embodiments, an erase operation may be performed on a block of memory cells containing one or more memory cells targeted for programming before they are programmed. For example, the one or more target memory cells may be erased (and which, in some embodiments, might be "softly" programmed after erasure) to an erase data state corresponding to a range of erase (e.g., negative) threshold voltages. The erase data state may be assigned a logic 1 state for a single-level cell programming or a logic 11 state for two-bit-per-cell programming, for example.

For some embodiments, the objective may be to program a target memory cell to have a program threshold voltage of at least Vt2 (FIG. 3C) so that the program threshold voltage of target memory cell lies within a certain range Vt2R2 of program threshold voltages that may start at the program threshold voltage Vt2. Note that the program threshold voltage Vt2 will be different for each of the plurality of program data states for multilevel programming.

A target memory cell may be first programmed to at least a program threshold voltage Vt1 (e.g., a first program verify voltage), using a first program operation, so that the threshold voltage of the target memory cell lies within the threshold voltage range Vt1R1 (FIG. 3A). After waiting for a relaxation time, e.g., after the target memory cell has relaxed and has a threshold voltage that lies within the threshold voltage range Vt1R2, as shown in FIGS. 3A and 3B, the target memory cell may be read during a first read operation using a first read voltage VREAD1 that is lower than threshold voltage Vt1. For example, read voltage VREAD1 may be about 0.5 V less than threshold voltage Vt1. The first read operation determines the data state of the target memory cell.

After the first read operation, the target memory cell may be programmed to at least a program threshold voltage Vt2 (e.g., a second program verify voltage), using a second program operation, so that the threshold voltage of the target memory cell lies within the threshold voltage range Vt2R1 in FIG. 3C. For example, program threshold voltage Vt2 may be about 0.5 V greater than program threshold voltage Vt1.

The data state read from the target memory cell during the first read operation may be used to program the target memory cell during the second program operation until the threshold voltage of the target memory cell reaches at least program threshold voltage Vt2. For example, the data state read from the target memory cell could be loaded into a data register to indicate the desired program data state. For subsequent read operations, e.g., after the target memory cell has been successfully programmed to have a threshold voltage that lies within the threshold voltage range Vt2R1, as shown in FIG. 3C, the target memory cell may be read using a second read voltage that may be less than program threshold voltage Vt2 and that may be greater than the first read voltage VREAD1.

Performing a first programming operation of a memory cell using a first program verify voltage (e.g., Vt1) that is lower than a desired program verify voltage (e.g., Vt2) for that memory cell, returning to read the data state from that memory cell after successful completion of the first programming operation, and performing a second programming operation on that memory cell using the desired program verify voltage, can facilitate a reduction in the range of threshold voltages corresponding to a particular program data state. For example, the width of a program threshold voltage range may generally be related to the degree of change in threshold voltage of the memory cells being programmed, e.g., programming a group of memory cells from −0.5V to 1.5V might be expected to result in a more narrow range of threshold voltages than programming a group of memory cells from −0.5V to 2.5V under similar circumstances. As such, after a relaxation time, where the threshold voltage range of the target memory cells has expanded from Vt2R1 to Vt2R2, the resulting threshold voltage range Vt2R2 (FIG. 3C) might be narrower than the threshold voltage range Vt1R2 (FIG. 3B), where the difference between the initial threshold voltage range Vt1R1 and the threshold voltage range Vt1R2 is greater than the difference between the threshold voltage range Vt2R1 and the threshold voltage range Vt2R2.

The first program operation may commence with loading data, to be programmed in the target memory cell, into cache register 118. For example, the data may be received from processor 130 (FIG. 1) with a write command from processor 130 and may be loaded and programmed in response to the received write command. The target memory cell may then be programmed to at least the program threshold voltage Vt1 (FIG. 3A).

For some embodiments, target memory cells may be programmed to have a program threshold voltage of at least Vt1 by applying a first programming voltage pulse of the first program operation, e.g., having a program starting voltage (e.g., typically insufficient to program a memory cell to a threshold voltage of at least Vt1), to the selected word line, and thus the control gates of the target memory cells. Subsequently, after applying the first programming pulse, the selected word line may be discharged, and a program verify may be performed by applying the first program verify voltage to the selected word line. If the program verify indicates that one or more of the target memory cells are programmed to at least the threshold voltage Vt1, the programming to at least the threshold voltage Vt1 is completed for those memory cells.

If more than a threshold number (which in some cases may be "any") of the target memory cells remain unprogrammed to a threshold voltage of at least Vt1, the remaining target memory cells then receive, at their control gates, a second programming voltage pulse of the first program operation, while the target memory cells already programmed to at least the threshold voltage Vt1 and other untargeted memory cells associated with the word line are inhibited from programming. The voltage of the second programming voltage pulse may exceed the voltage of the first programming voltage pulse by a step voltage. For example, the voltage of the second programming voltage pulse may be obtained by adding the step voltage to the voltage of the first programming voltage pulse.

If a subsequent program verify indicates that one or more of the remaining target memory cells are now programmed to at least the threshold voltage Vt1, the programming to at least the threshold voltage Vt1 is completed for those memory cells. This sequence may be repeated, e.g., using a third programming voltage pulse of the first program operation obtained by adding the step voltage to the second programming voltage pulse, using a fourth programming voltage pulse of the first program operation obtained by adding the step voltage to the third programming voltage pulse, etc., until at least a threshold number (which in some cases may be all or a certain percentage of all) of the target memory cells are programmed to at least the threshold voltage Vt1. That is, until at least a threshold number of target memory cells have threshold voltages that lie within the program-threshold-voltage range Vt1R1.

Note that for a multilevel programming (e.g., a programming a memory cell to one of a plurality of different program data states), the aforementioned first program operation may performed for each program data state using a different value of the threshold voltage Vt1. For example, a target memory cell may be programmed to at least threshold voltages $Vt1_1$, $Vt1_2$, ..., $Vt1_M$ respectively for program data states 1, 2, ..., M of the target memory cell. For example, a different data state may be programmed by programing the target memory cell to at least a corresponding one of a plurality of different threshold voltages $Vt1_1$, $Vt1_2$, $Vt1_M$.

For some embodiments, after at least a threshold number (which in some cases may be all or a certain percentage of all) of the target memory cells are programmed to at least the threshold voltage Vt1, other operations may then be performed on the memory array, e.g., while waiting for a relaxation time (e.g., one millisecond to one second). For example, other memory cells may be programmed or read.

For other embodiments, a register, such as a flag register, e.g., that may be located in command register 124, may be set to a certain value (e.g., a unitary 0) after programming the target memory cells to at least the threshold voltage Vt1 to indicate that the target memory cells are programmed to at least the threshold voltage Vt1. In other words, the certain value indicates that the first program operation is completed for at least the threshold number of the target memory cells.

Since programming the other memory cells may involve loading other data, to be programmed into the other memory cells, into cache register 118 or reading other memory cells may involve receiving data read from the other memory cells in cache register 118, cache register 118 may no longer contain the original data that was programmed into the target memory cells that are now programmed to at least the threshold voltage Vt1. For example, the other data to be programmed into the other memory cells or the data read from the other memory cells may replace the original data in cache register 118 that was programmed into the target memory cells.

While the other operations are being performed, the threshold voltages on the target memory cells may increase, due to the charge redistribution within the target memory cells, e.g., due to the relaxation of the target memory cells, so that the target memory cells have threshold voltages lie within range Vt1R2 that is ΔVt1 greater than the range Vt1R1.

At the certain time (e.g., one millisecond to one second) after the target memory cells are programmed to at least the threshold voltage Vt1, the target memory cells may be read by applying the first read voltage VREAD1 to the word line coupled to the control gates of the target memory cells. In other words, the first read voltage VREAD1 may be applied to the target memory cells to determine which of the target memory cells have threshold voltages greater than or equal to VREAD1, e.g., threshold voltages within range Vt1R2.

Note that for multilevel programming, the aforementioned read operation may be performed for each program data state using a different value of the first read voltage VREAD1. For example, a target memory cell may be read using read voltages $VREAD1_1$, $VREAD1_2$, ..., $VREAD1_M$ respectively for the program data states 1, 2, ..., M of the target memory cell, where the read voltages $VREAD1_1$, $VREAD1_2$, ..., $VREAD1_M$ are respectively less than the threshold voltages $Vt1_1$, $Vt1_2$, ..., $Vt1_M$. For example, different ones of the data states may be read using respective ones of the different read voltages $VREAD1_1$, $VREAD1_2$, ..., $VREAD1_M$.

Reading the target memory cells determines the original data that was originally intended for the target memory cells. The data read from the target memory cells using the read voltage VREAD1 may be loaded into cache register 118 during the read operation, thereby restoring the original data to cache register 118 that was replaced during the other operations. The original data restored to cache register 118 may then be programmed a second time (e.g., reprogrammed) into the target memory cells using the second program operation to program the target memory cells to at least the threshold voltage Vt2.

For some embodiments, control logic 116 may read the flag register before performing the second programming operation. If the flag register is set to the certain value, indicative that the target memory cells are programmed to at least the threshold voltage Vt1, control logic 116 starts to program the target memory cells to at least the threshold voltage Vt2. That is, the control logic 116 starts to program the target memory cells to at least the threshold voltage Vt2 in response to determining that the flag register is set to the certain value.

Note that the second program operation starts with the target memory cells being programmed to at least the threshold voltage Vt1, e.g., with the target memory cells lying in the range Vt1R1. That is, the target memory cells are preprogrammed by the first program operation to at least the threshold voltage Vt1 so that their threshold voltages lie in the range (e.g., the initial range) Vt1R1 at the start of the second program operation.

For some embodiments, the target memory cells may be programmed to have a program threshold voltage of at least Vt2 by applying a first programming voltage pulse of the second program operation, e.g., having an initial voltage (e.g., typically insufficient to program a memory cell to a threshold voltage of at least Vt2), to the selected word line, and thus the control gates of the target memory cells. Note that the initial voltage used to program the threshold voltage of at least Vt2 is greater than the initial voltage used to program the threshold voltage of at least Vt1.

Subsequently, after applying the first programming pulse of the second program operation, the selected word line may be discharged and a program verify performed by applying the second program verify voltage to the selected word line. If the program verify indicates that one or more of the target memory cells are programmed to at least the threshold voltage Vt2, the programming to at least the threshold voltage Vt2 is completed for those memory cells.

If more than a threshold number (which in some cases may be "any") of the target memory cells remain unprogrammed to a threshold voltage of at least Vt2, the remaining target memory cells then receive, at their control gates, a second programming voltage pulse of the second program operation, while the target memory cells already programmed to at least the threshold voltage Vt2 and other untargeted memory cells associated with the word line are inhibited from programming. The voltage of the second programming voltage pulse may exceed the voltage of the first programming voltage pulse by the step voltage, e.g., used above in the first program operation. For example, the voltage of the second programming voltage pulse may be obtained by adding the step voltage to the voltage of the first programming voltage pulse.

If a subsequent program verify indicates that one or more of the remaining target memory cells are now programmed to at least the threshold voltage Vt2, the programming to at least the threshold voltage Vt2 is completed for those memory cells. This sequence may be repeated, e.g., using a third programming voltage pulse of the second program operation obtained by adding the step voltage to the second programming voltage pulse, using a fourth programming voltage pulse of the second program operation obtained by adding the step voltage to the third programming voltage pulse, etc., until at least a threshold number (which in some cases may be all or a certain percentage of all) of the target memory cells are programmed to at least the threshold voltage Vt2. That is, until at least a threshold number of the target memory cells have threshold voltages that lie within the program-threshold-voltage range Vt2R1 that may start with the program threshold voltage Vt2, as shown in FIG. 3C.

For some embodiments, the flag register may be set to a certain other value to indicate that the target memory cells are programmed to at least the threshold voltage Vt2. In other words, the certain other value indicates that the second program operation is completed for at least the threshold number of the target memory cells. For example, a two-bit flag register might be set to a value of 11 at the beginning of programming, set to a value of 10 to indicate that the first program operation is completed, and set to a value of 00 to indicate that the second program operation is completed.

Note that for multilevel programming, the aforementioned second program operation may performed for each program data state using a different value of the threshold voltage Vt2 that is greater than the threshold voltage Vt1 for the respective program data state. For example, a target memory cell may be reprogrammed to at least threshold voltages $Vt2_1$, $Vt2_2$, ..., $Vt2_M$ respectively for program data states 1, 2, ..., M of the target memory cell, where the threshold voltages $Vt2_1$, $Vt2_2$, ..., $Vt2_M$ are respectively greater than the threshold voltages $Vt1_1$, $Vt1_2$, ..., $Vt1_M$ of the first program operation. That is, a memory cell may be reprogrammed to the different ones of the data states 1, 2, ..., M using the read voltages read voltages $VREAD1_1$, $VREAD1_2$, ..., $VREAD1_M$, where reprogramming each data state comprises programming the memory cell to at least a corresponding one of the threshold voltages $Vt2_1$, $Vt2_2$, ..., $Vt2_M$.

At the certain time (e.g., one millisecond to one second) after the second program operation, the threshold voltages of the target memory cells have again increased, due to the charge redistribution within the target memory cells, e.g., due to the relaxation of the target memory cells, so that the target memory cells have threshold voltages that lie in range Vt2R2 that is $\Delta Vt2$ greater than the range Vt2R1 (FIG. 3C).

For some embodiments, the second read operation may be performed after the relaxation time to read the relaxed target memory cells that lie in range Vt2R2 in response to control logic 116 receiving an external read command from processor 130. Note that although the second read may be performed in response to an external read command from processor 130, the first read may be performed as a part of the internal programming cycle. For example, the programming cycle may include an internal read command for performing the first read.

The increase $\Delta Vt2$ of the range of threshold voltages due to the relaxation after the second program operation may be less than the increase $\Delta Vt1$ of the range of threshold voltages due to the relaxation after the first program operation. Therefore, the range Vt2R2 may be narrower than the range Vt1R2. This can occur where the second program operation commenced with substantially relaxed target memory cells preprogrammed to at least the threshold voltage Vt1, i.e., having threshold voltages lying in the range Vt1R2.

For example, the first program operation may add more electrons to the blocking dielectrics of the target memory cells to program the target memory cells to at least the threshold voltage Vt1 from an erased data state than the second program operation adds to program the target memory cells to at least the threshold voltage Vt2 from at least the threshold voltage Vt1. This can occur where the first program operation preprograms the target memory cells prior to the second program operation, thereby possibly reducing the number of electrons that need to be added to the target memory cells by the second program operation to program the target memory cells to at least the threshold voltage Vt2. This might act to reduce the amount of charge that is redistributed during relaxation, and thus the amount of widening of the range of threshold voltages.

In a specific non-limiting example, for single-bit-per-memory-cell programming, the original data may be 10010011 respectively for target memory cells $208_1$ coupled to word line $202_1$ in FIG. 2. The target memory cells corresponding to the logic 1's are inhibited and the target memory cells to be programmed to logic 0's are programmed to at least threshold voltage Vt1 during the first program operation. Then, after the relaxation time, the target memory cells are read using the read voltage VREAD1, which, because it is lower than threshold voltage Vt1, determines that target memory cells store 10010011, replicating the original data. This read (e.g., sensed) data is then used like original data to determine which cells should be reprogrammed to at least threshold voltage Vt2 during the second program operation. The read is performed because the original data may no longer be held by the memory device (e.g., cache register 118) due to possible intervening operations. The read may be performed at the reduced voltage because the target memory cells have not yet been programmed to at least threshold voltage Vt2.

For some embodiments, an entire data set to be programed into the memory array may be divided into data segments (e.g., data chunks). For example, a data chunk may correspond to a page of data, a portion of a page of data, etc.

Figure 4:
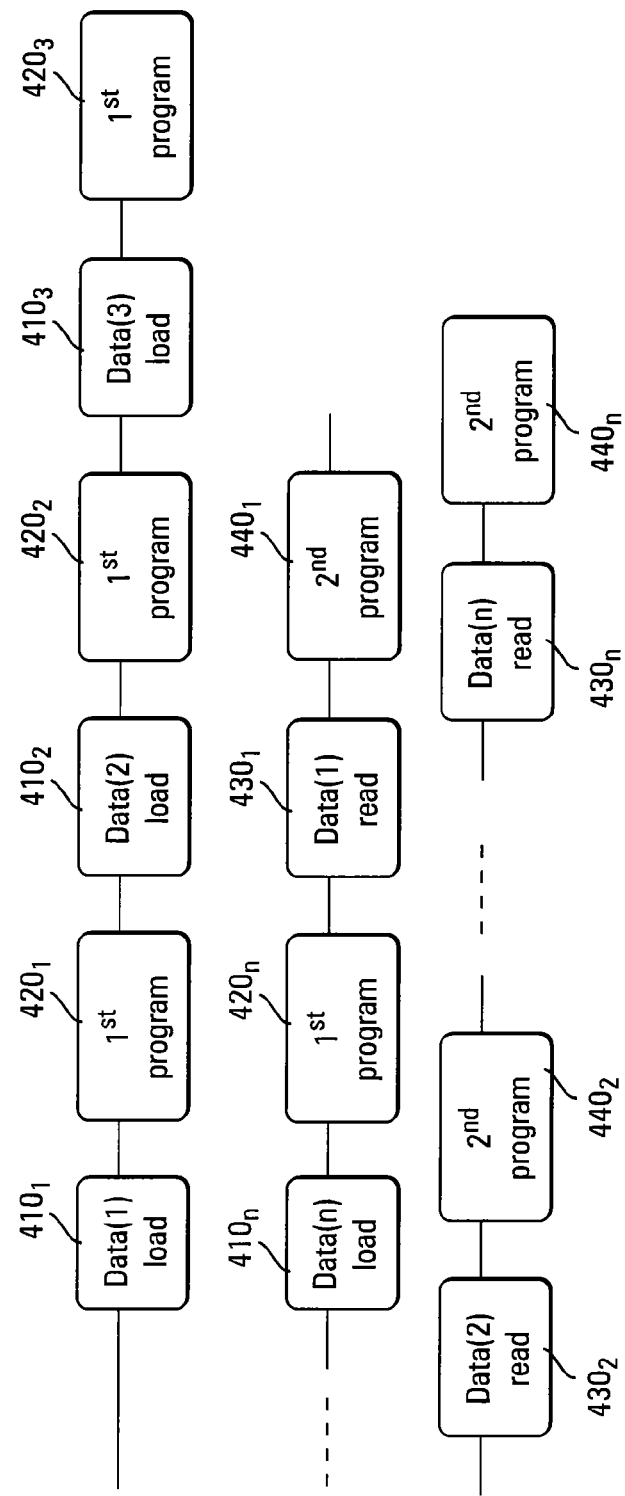
FIG. 4 is a block diagram illustrating programming data in chunks, according to another embodiment.

FIG. 4 is a block diagram illustrating how a data set divided into n chunks might be programmed, according to an embodiment. A first data chunk, data (1), may be loaded into cache register 118 at block $410_1$. Then, at block $420_1$, a first program operation is performed for data (1) by programming a corresponding first segment (e.g., chunk) of target memory cells with data (1) to at least threshold voltage Vt1, as described above in conjunction with FIG. 3A.

For multilevel programming, each value of data of data (1) is loaded into cache register 118 at block $410_1$, and then the first program operation at block $420_1$ may be performed for each program data state using a different value of the threshold voltage Vt1. For example, the first chunk memory cells may be programmed to at least threshold voltages $Vt1_1$, $Vt1_2$, ..., $Vt1_M$ respectively for data states 1, 2, ..., M of the multilevel cells at block $420_1$. That is, the M states of data (1) may be respectively programmed to at least the threshold voltages $Vt1_1$, $Vt1_2$, ..., $Vt1_M$.

The aforementioned loading and first program operation may then be performed for each of the remaining n−1 data chunks, e.g., for the second data chunk, data (2), to the nth data chunk, data (n). For example, data (2) may be loaded into cache register 118 at block $410_2$, thereby replacing data (1) in cache register 118. Subsequently, at block $420_2$, a first program operation is performed for data (2) by programming a corresponding second chunk of target memory cells with data (2) to at least threshold voltage Vt1. This may continue until data (n) is loaded into cache register 118 at block $410_n$, and subsequently, at block $420_n$, a first program operation is performed for data (n) by programming a corresponding nth chunk of target memory cells with data (n) to at least threshold voltage Vt1.

Note that for multilevel programming, each of the remaining data chunks data (2) to data (n) may include data intended to be programmed at each program data state, and the first program operation at each of blocks $420_2$-$420_n$ may performed for each program data state using a different value of the threshold voltage Vt1. For example, each of the remaining chunks of target memory cells may be programmed to threshold voltages $Vt1_1$, $Vt1_2$, Vt1 respectively for program data states 1, 2, ..., M of the memory cells at respective ones of blocks $420_2$ to $420_n$. That is, the M states of each of data (1) to data (n) may be respectively programmed to at least the threshold voltages $Vt1_1$, $Vt1_2$, ..., $Vt1_M$.

For some embodiments, after the first program operation at each of blocks $420_1$ to $420_n$ is completed, and the chunks of memory cells are respectively programed with data (1) to data (n) by programming each of the chunks of memory cells to at least threshold voltage Vt1, flag registers (e.g., in command register 124) respectively corresponding the chunks of memory cells may be set to certain values to respectively indicate the chunks of memory cells are programed to at least threshold voltage Vt1.

After data (n) is programed at block $420_n$, data (1) may be read, using the read voltage VREAD1, from the corresponding first chunk of memory cells at block $430_1$, e.g., after waiting the relaxation time after the first chunk of memory cells is programmed to at least threshold voltage Vt1 at block $420_1$. For example, the load/first program operations at blocks $410_2$/$420_2$ to $410_n$/$420_n$ may take place during the relaxation time. Note that data cache 118 may contain data (n) just prior to the read at block $430_1$. Therefore, the read at block $430_1$ may replace data (n) with data (1).

For multilevel programming, the read operation at block $430_1$ may be performed for each program data state using a different value of the read voltage VREAD1. For example, the first chunk of target memory cells may be read using the read voltages $VREAD1_1$, $VREAD1_2$, ..., $VREAD1_M$ respectively for the program data states 1, 2, ..., M of the first chunk of target memory cells at block $430_1$, where the read voltages $VREAD1_1$, $VREAD1_2$, ..., $VREAD1_M$ are respectively less than the threshold voltages $Vt1_1$, $Vt1_2$, ..., $Vt1_M$ to which the first chunk of memory cells is programmed using the first program operation at block $410_1$.

After the read operation at block $430_1$, data (1) are programed into the first chunk of memory cells at block $440_1$, using a second program operation to program the first chunk of data cells to at least threshold voltage Vt2, as described above in conjunction with FIG. 3C. For some embodiments, the flag register may be read prior to the second programming operation to determine whether the first program operation has been performed. For example, the second program operation at block $440_1$ may be performed in response to determining that the first program operation has been performed, i.e., the first chunk of memory cells is programmed to at least threshold voltage Vt1.

For multilevel programming, the second program operation at block $440_1$ may be performed for each program data state using a different value of the threshold voltage Vt2 that is greater than the threshold voltage Vt1 for the respective program data state. For example, the first chunk of target memory cells may be programmed to at least the threshold voltages $Vt2_1$, $Vt2_2$, ..., $Vt2_M$ respectively for program data states 1, 2, ..., M of the first chunk of target memory cells, where the threshold voltages $Vt2_1$, $Vt2_2$, ..., $Vt2_M$ are respectively greater than the threshold voltages $Vt1_1$, $Vt1_2$, ..., $Vt1_M$ programed during the first program operation at block $420_1$.

The aforementioned read operation and subsequent second program operation may then be performed for each of the remaining n−1 data chunks, e.g., for data (2) to data (n). Data (2) may be read, using the read voltage VREAD1, from the corresponding second chunk of memory cells at block $430_2$, e.g., after waiting the relaxation time after the second chunk of memory cells is programmed to at least threshold voltage Vt1 at block $420_2$. For example, the load/first program operations at blocks $410_3/420_3$ to $410_n/420_n$ and the read/second program operation at block $430_1/440_1$ may take place during the relaxation time. Note that data cache 118 may contain data (1) just prior to the read at block $430_2$. Therefore, the read at block $430_2$ replaces data (1) with data (2). Data (2) is then programmed into the second chunk of memory cells at block $440_2$ by programming the second chunk of memory cells to at least threshold voltage Vt2 using the second program operation.

Read/second program operations may continue until the nth data chunk, data (n), is read at block $430_n$, and subsequently, at block $440_n$, a second program operation is performed for data (n) by programming the corresponding nth chunk of target memory cells with data (n) to at least threshold voltage Vt2. Data (n) may be read, using the read voltage VREAD1, from the corresponding nth chunk of memory cells at block $430_n$, e.g., after waiting the certain time after the nth chunk of memory cells is programmed to at least threshold voltage Vt1 at block $420_n$. Data (n) is then programmed into the nth chunk of memory cells at block $440_n$ by programming the nth chunk of memory cells to at least threshold voltage Vt2 using the second program operation.

For some embodiments, each second program operation may be performed on the remaining chunks of target memory cells in response to determining, from the flag registers corresponding to the remaining chunks of target memory cells, that respective ones of the remaining chunks of target memory cells have been programmed to at least the threshold voltage Vt1 using a first program operation. Note that after each second program operation programs a respective chunk of target memory cells to at least threshold voltage Vt2, the value of the flag register, corresponding to the respective chunk of target memory cells, may be changed to a value indicating that the second program operation has been performed and that the respective chunk of target memory cells is programmed to at least threshold voltage Vt2.

For multilevel programming, the read operation at each of the remaining blocks $430_2$ to $430_n$ may be performed for each program data state using a different value of the read voltage VREAD1. For example, each remaining chunk of target memory cells may be read using the read voltages $VREAD1_1$, $VREAD1_2$, ..., $VREAD1_M$ respectively for the program data states 1, 2, ..., M at a respective one of the blocks $430_2$ to $430_n$, where the read voltages $VREAD1_1$, $VREAD1_2$, ..., $VREAD1_M$ are respectively less than the threshold voltages $Vt1_1$, $Vt1_2$, ..., $Vt1_M$ programmed during the first program operation at a respective one of the blocks $410_2$ to $410_n$.

Also, for multilevel programming, each of data (2) to data (n) may include data intended to be programed at each program data state, and the second program operation at each of blocks $440_2$-$440_n$ may performed at each program data state using a different value of the threshold voltage Vt2. For example, each of the remaining chunks of target memory cells may be programmed to at least the threshold voltages $Vt2_1$, $Vt2_2$, ..., $Vt2_M$ respectively for program data states 1, 2, ..., M at a respective one of blocks $440_2$ to $440_n$, where the threshold voltages $Vt2_1$, $Vt2_2$, ..., $Vt2_M$ are respectively greater than the threshold voltages $Vt1_1$, $Vt1_2$, ..., $Vt1_M$ programed during each first program operation at a respective one of blocks $420_1$ to $420_n$.

In a specific non-limiting example, for multiple-bit-per-memory-cell programming, e.g., for a physical page of four-level memory cells, a programming sequence may include, for example: program a first page (e.g., the lower page) to at least the threshold voltage Vt1 for the first page, and program a second page (e.g., the upper page) to at least the respective threshold voltages Vt1s for the second page. At a relaxation time after programing the first page to at least the threshold voltage Vt1 for the first page, read the first page using the read voltage VREAD1 for the first page that is less than the threshold voltage Vt1 for the first page, and at a relaxation time after programing the second page to at least the respective threshold voltages Vt1s for the second page, read the second page using the respective read voltages VREAD1s for the second page that are less than the respective threshold voltages Vt1s for the second page. After reading the first page, programing the first page to at least the threshold voltage Vt2 for the first page that is greater than the threshold voltage Vt1 for the first page, and after reading the second page, program the second page to at least the respective threshold voltages Vt2s for the second page that are greater than the respective threshold voltages Vt1s for the second page.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of programming a memory cell, comprising:
   programming the memory cell with a data value by programming the memory cell to at least a first threshold voltage;
   after programming the memory cell to at least the first threshold voltage, reading the data value from the memory cell using a read voltage that is less than the first threshold voltage; and
   after reading the data value from the memory cell, reprogramming the memory cell with the data value read from the memory cell by programming the memory cell to at least a second threshold voltage that is greater than the first threshold voltage.

2. The method of claim 1, further comprising waiting for a relaxation time after programming the memory cell to at least the first threshold voltage before reading the data value from the memory cell.

3. The method of claim 2, wherein waiting the relaxation time after programming the memory cell comprises waiting for a time in a range from one millisecond to one second.

4. The method of claim 2, further comprising programming another memory cell while waiting for the relaxation time.

5. The method of claim 1, further comprising loading a register with the data value read from the memory cell, wherein programming the memory cell to at least the second threshold voltage is done in response to loading the register with the data value read from the memory cell.

6. The method of claim 2, further comprising determining that the memory cell is programmed to least the first threshold voltage before waiting for the relaxation time.

7. The method of claim 6, further comprising setting a flag in a register in response to determining that the memory cell is programmed to least the first threshold voltage.

8. The method of claim 1, wherein the first threshold voltage is a first program verify voltage and wherein programming the memory cell to at least a first threshold voltage comprises applying the first program verify voltage to the memory cell.

9. The method of claim 8, wherein the second threshold voltage is a second program verify voltage and wherein programming the memory cell to at least a second threshold voltage comprises applying the second program verify voltage to the memory cell.

10. The method of claim 5, wherein loading the register with the data value read from the memory cell restores the data value that was programmed into the memory cell by programming the memory cell to at least the first threshold voltage for use in reprogramming the memory cell with the data value read from the memory cell by programming the memory cell to at least the second threshold voltage.

11. A method of programming a memory array of a memory device, comprising:
programming a plurality of target memory cells with data by programming at least a threshold number of the plurality of target memory cells to at least a first threshold voltage;
reading the data from the at least the threshold number of the plurality of target memory cells using a read voltage that is less than the first threshold voltage; and
reprogramming the at least the threshold number of the plurality of target memory cells with the read data by programming the at least the threshold number of the plurality of target memory cells to at least a second threshold voltage that is greater than the first threshold voltage.

12. A method of programming a memory array of a memory device, comprising:
programming a plurality of target memory cells with data by programming at least a threshold number of the plurality of target memory cells to at least a first threshold voltage;
reading the data from the at least the threshold number of the plurality of target memory cells using a read voltage that is less than the first threshold voltage; and
reprogramming the at least the threshold number of the plurality of target memory cells with the read data by programming the at least the threshold number of the plurality of target memory cells to at least a second threshold voltage that is greater than the first threshold voltage;
wherein the read voltage is a first read voltage and further comprising reading the at least the threshold number of the plurality of target memory cells programed to at least the second threshold voltage using a second read voltage that is greater than the first read voltage.

13. The method of claim 12, wherein the second read voltage is less than the second threshold voltage.

14. The method of claim 12, wherein reading the at least the threshold number of the plurality of target memory cells using a second read voltage is in response to receiving an external read command at the memory device.

15. The method of claim 11, wherein the data is first data, and further comprising programming other memory cells with second data while waiting for a relaxation time after programming the at least the threshold number of the plurality of target memory cells to at least the first threshold voltage.

16. A method of programming a memory array of a memory device, comprising:
programming a plurality of target memory cells with data by programming at least a threshold number of the plurality of target memory cells to at least a first threshold voltage;
reading the data from the at least the threshold number of the plurality of target memory cells using a read voltage that is less than the first threshold voltage; and
reprogramming the at least the threshold number of the plurality of target memory cells with the read data by programming the at least the threshold number of the plurality of target memory cells to at least a second threshold voltage that is greater than the first threshold voltage;
wherein the data is first data, and further comprising programming other memory cells with second data while waiting for a relaxation time after programming the at least the threshold number of the plurality of target memory cells to at least the first threshold voltage, and further comprising:
loading a register with the first data before programming the plurality of target memory cells to at least the first threshold voltage;
replacing the first data in the register with the second data before programming the other memory cells; and
loading the register with the first data read from the at least the threshold number of the plurality of target memory cells before programming the plurality of target memory cells to at least the second threshold voltage.

17. The method of claim 15, wherein programming the other memory cells with the second data comprises programming the other memory cells to at least the first threshold voltage.

18. A method of programming a memory array of a memory device, comprising:
programming a plurality of target memory cells with data by programming at least a threshold number of the plurality of target memory cells to at least a first threshold voltage;
reading the data from the at least the threshold number of the plurality of target memory cells using a read voltage that is less than the first threshold voltage; and
reprogramming the at least the threshold number of the plurality of target memory cells with the read data by programming the at least the threshold number of the plurality of target memory cells to at least a second threshold voltage that is greater than the first threshold voltage;
wherein the data is first data, and further comprising programming other memory cells with second data while waiting for a relaxation time after programming the at least the threshold number of the plurality of target memory cells to at least the first threshold voltage; and
wherein programming the other memory cells with the second data comprises programming the other memory cells to at least the first threshold voltage and, further comprising:
reading the other memory cells using a read voltage after reprogramming the plurality of target memory cells with the first data; and
reprogramming the other memory cells with the second data by programming the other memory cells to at least the second threshold voltage.

19. The method of claim 11, further comprising storing a value on the memory device, indicating that the plurality of target memory cells are programmed to at least the first threshold voltage.

20. A method of programming a memory array of a memory device, comprising:
loading a register with a first data value;
programming a first memory cell with the first data value by programming the first memory cell to at least a first threshold voltage;
after programming the first memory cell, loading the register with a second data value;
programming a second memory cell with the second data value;
after programming the second memory cell, reading the first data value from the first memory cell using a read voltage less than the first threshold voltage;
reprogramming the first memory cell with the first data value read from the first memory cell by programming the first memory cell to at least a second threshold voltage greater than the first threshold voltage; and
after reprogramming the first memory cell, reprogramming the second memory cell with the second data value.

21. The method of claim 20, further comprising loading the register with the first data value read from the first memory cell before reprogramming the first memory cell with the first data value read from the first memory cell.

22. The method of claim 21, further comprising reading the second memory cell and loading the register with data read from the second memory cell before reprogramming the second memory cell.

23. The method of claim 20, wherein the first data value is different than the second data value.

24. A memory device, comprising:
a memory array; and
control logic configured to cause a data value to be programmed into a memory cell of the memory array by causing the memory cell to be programmed to least a first threshold voltage;
wherein the control logic is configured to cause the data value to be read from the memory cell, after the memory cell is programmed to at least the first threshold voltage, using a read voltage that is less than the first threshold voltage; and
wherein the control logic is configured to cause the read data to be reprogrammed into the memory cell, after reading the memory cell, by causing the memory cell to be programmed to at least a second threshold voltage that is greater than the first threshold voltage.

25. The memory device of claim 24, wherein the control logic is configured to determine that the memory cell is programmed to least the first threshold voltage before causing the memory cell to be programed to at least the second threshold voltage.

26. The memory device of claim 24, wherein the control logic is configured to wait for a relaxation time after causing the memory cell to be programmed to at least the first threshold voltage before causing the data value to be read from the memory cell.

27. The memory device of claim 26,
wherein the memory cell is a first memory cell; and
wherein the control logic is configured to cause a second memory cell of the memory array to be programmed during the relaxation time.

28. The memory device of claim 27, wherein the control logic is configured to cause the second memory cell to be reprogrammed after waiting for another relaxation time.

29. A memory device, comprising:
a memory array; and
control logic configured to cause a memory cell of the memory array to be programmed to least a first threshold voltage;
wherein the control logic is configured to cause the memory cell to be read, after the memory cell is programmed to at least the first threshold voltage, using a read voltage that is less than the first threshold voltage; and
wherein the control logic is configured to cause the memory cell to be programmed, after reading the memory cell, to at least a second threshold voltage that is greater than the first threshold voltage; and
wherein the read voltage is a first read voltage, and wherein the control logic is configured to cause the memory cell to be read after the memory cell is programmed to at least the second threshold voltage, in response to an external command, using a second read voltage that is greater than the first read voltage and less than the second threshold voltage.

30. The memory device of claim 26, wherein the relaxation time comprises a time in a range from one millisecond to one second.

31. A memory device, comprising:
a memory array;
a register; and
control logic configured to cause the register to be loaded with a first data value;
wherein the control logic is configured to cause a first memory cell of the memory array to be programmed with the first data value by causing the first memory cell to be programmed to at least a first threshold voltage;
wherein the control logic is configured to cause, after the first memory cell is programmed, the register to be loaded with a second data value;
wherein the control logic is configured to cause a second memory cell of the memory array to be programmed with the second data value;
wherein the control logic is configured to cause, after the second memory cell is programmed, the first data value to be read from the first memory cell using a read voltage less than the first threshold voltage;
wherein the control logic is configured to cause the first memory cell to be reprogrammed with the first data value read from the first memory cell by causing the first memory cell to be programmed to at least a second threshold voltage greater than the first threshold voltage; and
wherein the control logic is configured to cause, after reprogramming the first memory cell, the second memory cell to be reprogrammed.

32. The memory device of claim 31, wherein the control logic is configured to cause the register to be loaded with the first data value read from the first memory cell before causing the first memory cell to be reprogrammed.

33. The memory device of claim 32, wherein the control logic is configured to cause the register to be loaded with data read from the second memory cell before causing the second memory cell to be reprogrammed.

* * * * *

UNITED STATES PATENT AND TRADEMARK OFFICE
CERTIFICATE OF CORRECTION

PATENT NO. : 8,743,622 B2  Page 1 of 1
APPLICATION NO. : 13/349652
DATED : June 3, 2014
INVENTOR(S) : Toru Tanzawa It is certified that error appears in the above-identified patent and that said Letters Patent is hereby corrected as shown below:

In the Claims

In column 14, line 55, in Claim 3, delete "waiting the relaxation" and insert -- waiting for the relaxation --, therefor.
In column 14, line 66, in Claim 6, delete "programmed to least" and insert -- programmed to at least --, therefor.
In column 15, line 3, in Claim 7, delete "programmed to least" and insert -- programmed to at least --, therefor.
In column 17, line 38, in Claim 24, delete "programmed to least" and insert -- programmed to at least --, therefor.
In column 17, line 51-52, in Claim 25, delete "programmed to least" and insert -- programmed to at least --, therefor.
In column 18, line 7, in Claim 29, delete "programmed to least" and insert -- programmed to at least --, therefor.

Signed and Sealed this
Twenty-sixth Day of August, 2014

Michelle K. Lee
*Deputy Director of the United States Patent and Trademark Office*